United States Patent
Guo et al.

(10) Patent No.: US 9,082,992 B2
(45) Date of Patent: Jul. 14, 2015

(54) HYBRID ORGANIC SOLAR CELL WITH PEROVSKITE STRUCTURE AS ABSORPTION MATERIAL AND MANUFACTURING METHOD THEREOF

(71) Applicant: National Cheng Kung University, Tainan (TW)

(72) Inventors: Tzung-Fang Guo, Tainan (TW); Jyun-Yuan Jeng, Tainan (TW); Yi-Fang Chiang, Tainan (TW); Mu-Huan Lee, Tainan (TW); Chao-Yu Chen, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 13/947,070

(22) Filed: Jul. 21, 2013

(65) Prior Publication Data

US 2014/0332078 A1 Nov. 13, 2014

(30) Foreign Application Priority Data

May 9, 2013 (TW) .............................. 102116548 A (51) Int. Cl.
 *H01L 51/42* (2006.01)
(52) U.S. Cl.
 CPC ............. *H01L 51/424* (2013.01); *Y02E 10/549* (2013.01)
(58) Field of Classification Search
 CPC .................................................... H01L 51/424
 USPC .................................... 136/263, 252; 438/82
 See application file for complete search history.

(56) References Cited

U.S. PATENT DOCUMENTS

| | | | | |
|---|---|---|---|---|
| 2009/0056791 | A1* | 3/2009 | Pfenninger et al. | 136/247 |
| 2009/0095341 | A1* | 4/2009 | Pfenninger et al. | 136/246 |
| 2010/0180932 | A1* | 7/2010 | Wang et al. | 136/246 |
| 2010/0224248 | A1* | 9/2010 | Kenney et al. | 136/259 |

OTHER PUBLICATIONS

Jeng et al., "CH3NH3PbI3 Perovskite/Fullerene Planar-Heterojunction Hybrid Solar Cells", Adv. Mater. 2013, 25, 3727-3732, Published online on Jun. 17, 2013, Accessed from http://onlinelibrary.wiley.com/doi/10.1002/adma.201301327/pdf.*

Tanaka et al., "Comparative study on the excitons in lead-halide-based perovskitetype crystals CH3NH3PbBr3 CH3NH3PbI3", Solid State Communications 127 (2003) 619-623.*

* cited by examiner

*Primary Examiner* — Golam Mowla
(74) *Attorney, Agent, or Firm* — Mark M Friedman (57) ABSTRACT

A hybrid organic solar cell (HOSC) with perovskite structure as absorption material and a manufacturing method thereof are provided. The HOSC includes a conductive substrate, a hole transport layer, an active layer, a hole blocking layer and a negative electrode. The active layer has a light absorption layer (LAL) and an electron acceptor layer (EAL). The LAL is made of perovskite material represented by the following equation: $C_nH_{2n+1}NH_3XY_3$, n is positive integer form 1 to 9; X is Pb, Sn or Ge; and Y is at least one of I, Br or Cl. The EAL is made of at least one type of fullerene or derivatives thereof. A planar heterojunction (PHJ) is formed between the LAL and the EAL. The LAL has simple structure and fabricating process with relatively low cost, so that it is advantageous to carry out the mass production of HOSCs of flexible solid-state form.

18 Claims, 5 Drawing Sheets

HYBRID ORGANIC SOLAR CELL WITH PEROVSKITE STRUCTURE AS ABSORPTION MATERIAL AND MANUFACTURING METHOD THEREOF

CROSS REFERENCE TO RELATED APPLICATIONS

This application claims the priority of Taiwan Patent Application No. 102116548, filed on May 9, 2013, the disclosure of which is incorporated herein by reference.

BACKGROUND OF THE INVENTION

1. Field of the Invention

The present invention relates to a solar cell and a manufacturing method thereof, and more specifically to a hybrid organic solar cell with perovskite structure as absorption material and a manufacturing method thereof.

2. Description of the Prior Art

In recent years, it has been spotlighted as a development of various renewable energies (e.g., solar cell, fuel cell, wind power generation, etc.) because large quantities of fossil fuel are consumed. For example, an organic polymer solar cell is an attractive renewable energy technology with their advantages of low cost, easy fabricating process, flexibility and portability. In addition, the organic polymer solar cell is continuously improved and developed by many researchers, so that the practicality of the organic polymer solar cell is gradually increased, for instance, the organic polymer solar cell can be assembled on a building or clothing. Therefore, the organic polymer solar cell even has the opportunity to replace a current solar cell using a semiconductor substrate.

For example, a traditional organic polymer solar cell is arranged by sandwiching with a glass substrate, a positive electrode layer made of indium tin oxide (ITO), a hole transport layer made of PEDOT:PSS (poly(3,4-ethylenedioxythiophene):poly(styrene sulfonate)), an absorptive active layer made of P3HT:PCBM (poly(3-hexylthiohene):(6,6)-phenyl C61 butyric acid methyl ester) hybrid system and a negative electrode layer made of aluminum. The principle of current generation of the traditional organic polymer solar cell is to produce an exciting phenomenon by using P3HT to absorb photons of sunlight, and to produce free electrons by potential difference between P3HT/PCBM interfaces, so that electron-hole pairs are separated. This is so-called transferring process of photo-induced charge. Holes generated by absorbing a light source in the structure of the absorptive active layer are collected in the positive electrode layer made of indium tin oxide (ITO) through a hole collection layer made of PEDOT:PSS having high penetration and work function which can be matched. Electrons are mostly collected in a negative electrode modified with aluminum, and then electrically connected to an external circuit, thereby generate a current. In another traditional organic polymer solar cell, the absorptive active layer can also be classified into two separate layers (i.e., a P3HT layer and a PCBM layer), and a heterojunction is existed between the separate layers. The principle of current generation of the traditional organic polymer solar cell is the same as that of above-mentioned principle.

Above P3HT is an organic polymer material with a moderate molecular weight (about 40~60 KDa) and good carrier mobility, and incompatibility of PCBM, that will be able to form a good heterojunction, so that power conversion efficiency of the device is near 4% or greater than 4%. However, when a molecular weight of P3HT is too small, solution is hard to form a smooth film on the substrate, that is, molecules cannot be flatted efficiently on the entire surface of the substrate due to the small intermolecular force, so that the solution is condensed into small blocks, and it is difficult to form a complete film. Conversely, when a molecular weight is too large, thereby not only leads to poor solubility of the molecules in the solution, but also extent of phase separation of a heterojunction form of P3HT/PCBM is too obvious, thereby plunging carrier mobility thereof, and thus an effect for improving the power conversion efficiency of the device cannot be achieved. Therefore, when an absorption material of P3HT is manufactured, a size of molecular weight thereof must be strictly controlled. Furthermore, since P3HT is an organic polymer, and therefore a process required for organic synthesis thereof (e.g., a Grignard metathesis) is generally relatively more complex in comparison to a method for synthesizing an inorganic compound or small molecular organic compound, thereby equipment costs and processing costs required for synthesizing P3HT are relatively high, and thus advantageous to reduce the application for manufacturing and mass producing such the organic polymer solar cell.

Therefore, there is a need to provide a hybrid organic solar cell with perovskite structure as absorption material and a manufacturing method thereof, so as to overcome the disadvantage in the prior art.

SUMMARY OF THE INVENTION

A primary object of the present invention is to provide a hybrid organic solar cell with perovskite structure as absorption material and a manufacturing method thereof, wherein a light absorption layer is made of an organic-inorganic hybrid compound having simple structure and fabricating process with relatively low cost, that is, a traditional organic polymer absorption material having complex structure and fabricating process with relatively high cost (e.g., P3HT) are replaced by perovskite material of $C_nH_{2n+1}NH_3XY_3$, while fullerene ($C_{60}$) or derivatives thereof is used as an electron acceptor layer. A planar heterojunction (PHJ) is formed between the light absorption layer and the electron acceptor layer, thereby that is benefic to form a solid-state hybrid organic solar cell (flexible), as well as provide a simple manufacturing method and reduce mass production costs.

A secondary object of the present invention is to provide a hybrid organic solar cell with perovskite structure as absorption material and a manufacturing method thereof. An improved performance of the hybrid organic solar cell are provided by using fullerene ($C_{60}$) or derivatives with different lowest unoccupied molecular orbitals (LUMO) as an electron acceptor layer, controlling a surface morphology of perovskite material by means of casting the solution at various spinning speed and changing the solvent of the solution, or using a conductive substrate having different transparent conductive films, so that the power conversion efficiency (PCE) of the hybrid organic solar cell reaches above 3%.

To achieve the above object, the present invention provides the hybrid organic solar cell with perovskite structure as absorption material, which includes: a conductive substrate, a hole transport layer, an active layer, a hole blocking layer and a negative electrode in turn. The active layer includes:
a light absorption layer being made of perovskite structure as absorption material represented by the following equation (I):

$$C_nH_{2n+1}NH_3XY_3 \qquad (I),$$

wherein n represents an integer of 1 to 9; X represents lead (Pb), tin (Sn) or germanium (Ge); and Y represents at least one of iodine (I), bromine (Br) and chlorine (Cl); and an electron acceptor layer being made of at least one type of fullerene ($C_{60}$) or derivatives thereof;
wherein the light absorption layer of the active layer is in contacted with the hole transport layer, the electron acceptor layer is in contacted with the hole blocking layer, and a planar heterojunction (PHJ) is formed between the light absorption layer and the electron acceptor layer.

In one embodiment of the present invention, the perovskite structure as absorption material is $C_nH_{2n+1}NH_3X(I_mBr_{3-m})$ or $C_nH_{2n+1}NH_3X(I_mCl_{3-m})$, wherein m represents an integer of 1 to 2.

In one embodiment of the present invention, the perovskite structure as absorption material is $CH_3NH_3PbI_3$, $CH_3NH_3PbBr_3$, $CH_3NH_3PbI_2Cl$ or $CH_3NH_3PbI_2Br$.

In one embodiment of the present invention, the thickness of the light absorption layer is ranged between 20 nm and 40 nm.

In one embodiment of the present invention, the derivatives of the fullerene are selected from $PC_{61}BM$, $PC_{71}BM$, $C_{70}$ or ICBA.

In one embodiment of the present invention, the thickness of the electron acceptor layer is ranged between 20 nm and 40 nm.

In one embodiment of the present invention, the conductive substrate is selected from indium tin oxide (ITO) film substrate, aluminum zinc oxide (AZO) film substrate or indium zinc oxide (IZO) film substrate; and the conductive substrate has a flexible substrate or a rigid substrate. The flexible substrate is selected from polyethylene terephthalate (PET), polyethersulfone (PES), polyethylene naphthalate (PEN) or polycarbonate (PC).

In one embodiment of the present invention, the hole transport layer is selected from PEDOT:PSS, TFB or PTPD; the hole blocking layer is selected from BCP, Bphen, TpPyPB or DPPS; and the negative electrode is selected from aluminum (Al), silver (Ag) or gold (Au).

Furthermore, the present invention further provides a method for manufacturing a hybrid organic solar cell with perovskite structure as absorption material, and the method includes the following steps of:
(S10) providing a semi-finished product, the semi-finished product sequentially include a conductive substrate and a hole transport layer from bottom to top;
(S20) preparing an organic-inorganic hybrid solution with perovskite structure as absorption material, and spin-coating the organic-inorganic hybrid solution onto the hole transport layer of the semi-finished product to form a light absorption layer, wherein the perovskite structure as absorption material is shown as the following equation (I):

$$C_nH_{2n+1}NH_3XY_3 \qquad (I),$$

wherein n represents an integer of 1 to 9; X represents lead (Pb), tin (Sn) or germanium (Ge); and Y represents at least one of iodine (I), bromine (Br) and chlorine (Cl);
(S30) forming an electron acceptor layer onto the light absorption layer by vapor deposition, the electron acceptor layer being made of at least one type of fullerene ($C_{60}$) or derivatives thereof, wherein the light absorption layer and the electron acceptor layer are combined to form an active layer, and a planar heterojunction (PHJ) is formed between the light absorption layer and the electron acceptor layer; and
(S40) forming a hole blocking layer and a negative electrode onto the electron acceptor layer in turn, so as to form a solid-state hybrid organic solar cell.

In one embodiment of the present invention, before spin-coating the light absorption layer, further including the following step of:

(S11) pre-heating the semi-finished product for 5-10 minutes at 55-65° C.

In one embodiment of the present invention, the step of the formation for the light absorption layer using spin-coating includes the following steps of:
(S21) preparing a methylamine ($CH_3NH_2$) aqueous solution and a hydroiodic acid (HI) aqueous solution, respectively;
(S22) mixing the methylamine aqueous solution and the hydroiodic acid aqueous solution to form methyl ammonium iodide ($CH_3NH_3I$), and drying methyl ammonium iodide for the formation of methyl ammonium iodide powder;
(S23) adding the methyl ammonium iodide powder and lead iodide ($PbI_2$) into an organic solvent to form an organic-inorganic hybrid solution with perovskite structure as absorption material ($CH_3NH_3PbI_3$); and
(S24) spin-coating the organic-inorganic hybrid solution onto the hole transport layer of the semi-finished product to form the light absorption layer.

In one embodiment of the present invention, the step of the formation of the light absorption layer using spin-coating includes the following steps of:
(S21) preparing a methylamine ($CH_3NH_2$) aqueous solution and a hydrobromic acid (HBr) aqueous solution, respectively;
(S22) mixing the methylamine aqueous solution and the hydrobromic acid aqueous solution to form methyl ammonium bromide ($CH_3NH_3Br$), and drying methyl ammonium bromide for the formation of methyl ammonium bromide powder;
(S23) adding the methyl ammonium bromide powder and lead bromide ($PbBr_2$) into an organic solvent to form an organic-inorganic hybrid solution with perovskite structure as absorption material ($CH_3NH_3PbBr_3$); and
(S24) spin-coating the organic-inorganic hybrid solution onto the hole transport layer of the semi-finished product to form the light absorption layer.

In one embodiment of the present invention, the organic solvent is dimethylformamide (DMF) or r-butyrolactone.

In one embodiment of the present invention, the organic-inorganic hybrid solution is spin-coated at 6000-8000 rpm.

In one embodiment of the present invention, after the light absorption layer is formed by spin coating, further including the following step of:
(S25) annealing the light absorption layer for 10-20 minutes at 95-105° C.

BRIEF DESCRIPTION OF THE DRAWINGS

FIGS. 3A and 3F are the scanning electron microscopy (SEM) photographs (FIGS. 3A-3C & 3E-3F: 10000×; FIG. 3D: 5000×) of a surface morphology of perovskite structure as absorption material according to the preferred embodiment of the present invention, the surface morphology of perovskite structure as absorption material is controlled by changing a spinning speed of a spin coating (6000 rpm, 8000 rpm), with or without a pre-heating process for a surface of a semi-finished product (at room temperature, or 5 minutes at 60° C.) and the use of different organic solvents for the spin coating (r-butyrolactone and DMF)

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, in this regard, directional terminology, such as "up," "down," "top," "bottom," "front," "back," "left," "right," "inside," "outside," "side," "around," "center," "horizontal," "transverse," "vertical," "longitudinal," "axial," "radial," "top-most layer," "bottom-most layer," etc., is used with reference to the orientation of the Figure(s) being described. As such, the directional terminology is used for purposes of illustration and is in no way limiting.

Figure 1:
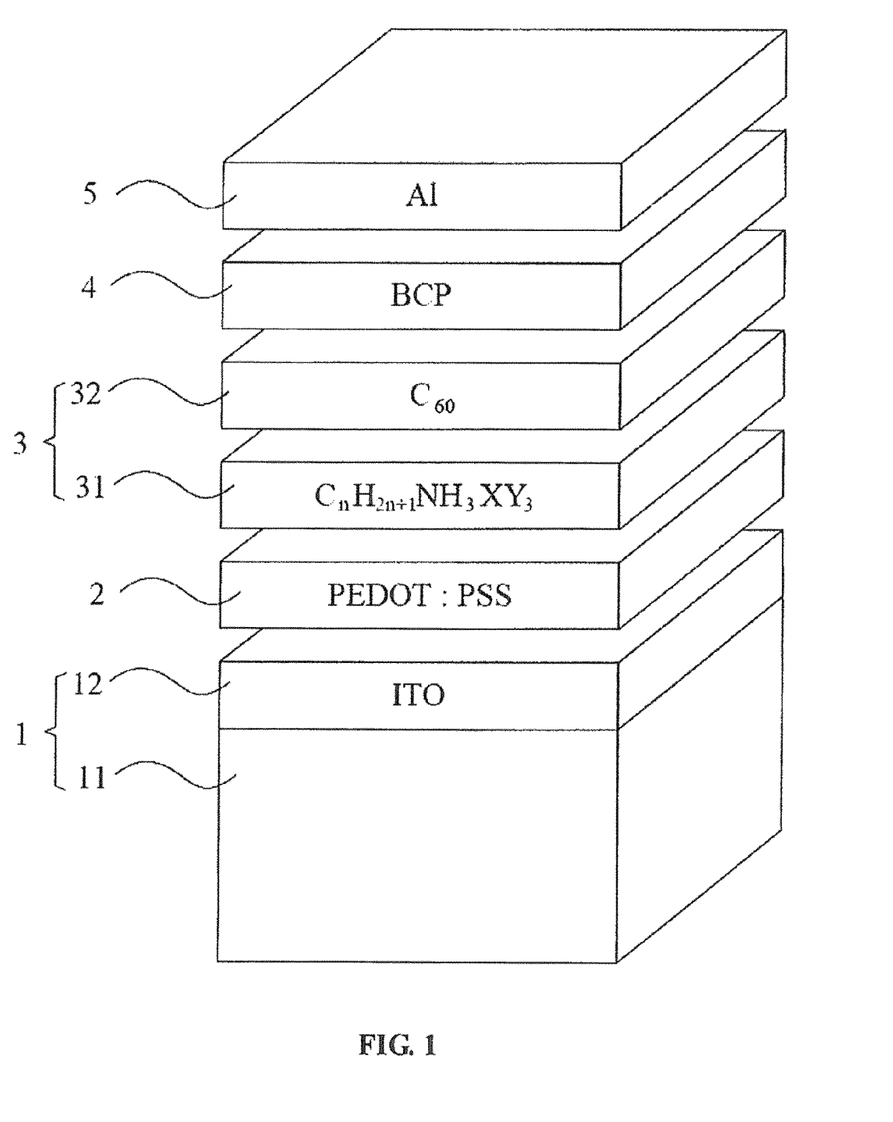
FIG. 1 is an exploded schematic view of a hybrid organic solar cell with perovskite structure as absorption material according to a preferred embodiment of the present invention.

Referring to FIG. 1, a hybrid organic solar cell with perovskite structure as absorption material according to a preferred embodiment of the present invention is illustrated. As shown, the hybrid organic solar cell with perovskite structure as absorption material includes a conductive substrate 1, a hole transport layer 2, an active layer 3, a hole blocking layer 4 and a negative electrode 5 in turn. The active layer 3 includes a light absorption layer 31 and an electron acceptor layer 32. The features of the present invention is mainly in that a special perovskite structure as absorption material is used to manufacture the light absorption layer 31, as well as at least one type of fullerene ($C_{60}$) or derivatives thereof is used to manufacture the electron acceptor layer 32. Hereinafter, detail structures, assembled relationships and manufacturing method thereof of above various elements according to the preferred embodiments of the present invention will be described in detail with reference to the accompanying illustrative drawings.

Referring to FIG. 1, the conductive substrate 1 according to a preferred embodiment of the present invention has a substrate 11 and a transparent conductive film 12. The substrate 11 can be a flexible substrate or a rigid substrate, for example, a material of the flexible substrate can be selected from PET, PES, PEN or PC. A material of the rigid substrate can be selected from glass, but the present invention is not limited thereto. The transparent conductive film 12 is used as a positive electrode layer, and the transparent conductive film 12 can be selected from ITO film, AZO film or ZIO film, that is, the conductive substrate 1 can be any one of ITO film substrate, AZO film substrate or IZO film substrate, that are self-made or commercially available. For example, a commercially available ITO film substrate can be used in the present invention, wherein an ITO film is formed on a glass substrate or a flexible substrate (e.g., PET). Herewith, the thickness of the ITO film is about ranged between 150 nm and 250 nm, such as 200 nm.

Referring to FIG. 1 again, the hole transport layer 2 according to the preferred embodiment of the present invention is formed on the transparent conductive film 12 of the conductive substrate 1 to modify a surface roughness of the transparent conductive film 12 (e.g., ITO film), decrease leakage current, improve the stability of a device and provide an effect of transporting holes. The hole transport layer 2 can be considered as a part of the positive electrode layer. The hole transport layer 2 can be selected from PEDOT:PSS (poly(3,4-ethylenedioxythiophene):poly(styrenesulfonate)), TFB (poly[(9,9-dioctylfluorenyl-2,7-diyl)-co-(4,4'-(N-(4-sec-butylphenyl)diphenylamine)]) or PTPD (poly[N,N-bis(4-butylphenyl)-N,N'-bis(phenyl)-benzidine]), that are respectively shown as the following formulas:

wherein n within the formulas represents 2 or an integer greater than 2. Furthermore, the hole transport layer 2 can be formed on the transparent conductive film 12 by using a spin coating process or an imprinting process. The thickness of the hole transport layer 2 is about ranged between 25 nm and 40 nm.

Referring to FIG. 1 again, the active layer 3 according to the preferred embodiment of the present invention includes the light absorption layer 31 and the electron acceptor layer 32. The light absorption layer 31 is mainly made of perovskite structure as absorption material represented by the following equation (I):

$$C_nH_{2n+1}NH_3XY_3 \qquad (I),$$

wherein n represents an integer of 1 to 9; X can be lead (Pb), tin (Sn) or germanium (Ge), especially lead (Pb); and Y represents at least one of iodine (I), bromine (Br) and chlorine (Cl), especially iodine (I) or bromine (Br); For example, In one exemplary embodiment, the perovskite structure as absorption material can be $CH_3NH_3PbI_3$ or $CH_3NH_3PbBr_3$; or, in another exemplary embodiment, the perovskite structure as absorption material further can be $C_nH_{2n+1}NH_3X$ $(I_mBr_{3-m})$ or $C_nH_{2n+1}NH_3X(I_mCl_{3-m})$, wherein m represents an integer of 1 to 2. For example, the perovskite structure as absorption material can be $CH_3NH_3PbI_2Cl$ or $CH_3NH_3PbI_2Br$. Furthermore, the light absorption layer 31 is formed on the hole transport layer 2 by executing the spin coating process with a spinning speed of 6000-8000 rpm in the present invention. The thickness of the light absorption layer 31 is about ranged between 20 nm and 40 nm, such as 25 nm or 30 nm. The light absorption layer 31 can not only serves as an absorption material, but also the hole transport layer. The light absorption ability of the absorption material covers the range of light from visible to near infrared.

Furthermore, the electron acceptor layer 32 mainly receives electrons from the light absorption layer 31, and then the electrons are transferred to the hole blocking layer 4 and the negative electrode 5. The electron acceptor layer 32 is made of at least one type of fullerene ($C_{60}$) or derivatives thereof, wherein the derivatives of the fullerene can be selected from $PC_{61}BM$ ((6,6)-phenyl-C61 butyric acid methyl ester), $PC_{71}BM$ ((6,6)-phenyl C71 butyric acid methyl ester, mixture of isomers), $C_{70}$ ((5,6)-fullerene-C70) or ICBA (indene-C60 bis-adduct), that are respectively shown as the following formulas:

PC$_{61}$BM

PC$_{71}$BM

C$_{70}$

; and

ICBA

In one exemplary embodiment, the electron acceptor layer 32 can be made of a PCBM polymer material (i.e., $PC_{61}BM$ or $PC_{71}BM$). The electron acceptor layer 32 is formed on the light absorption layer 31 by means of vapor deposition. The thickness of the electron acceptor layer 32 is about ranged between 20 nm and 40 nm (e.g., 25 nm or 30 nm). A planar heterojunction (PHJ) is formed between the light absorption layer 31 and the electron acceptor layer 32. Detailed method for manufacturing the light absorption layer 31 and the electron acceptor layer 32 will now be discussed in further detail.

Referring to FIG. 1 again, the hole blocking layer 4 according to the preferred embodiment of the present invention is formed on the electron acceptor layer 32 by means of vapor deposition to block the holes, but to allow pass-through of the electrons and to reach the negative electrode 5. The hole blocking layer 4 can be selected from BCP (bathocuproine), Bphen (4,7-diphenyl-1,10-phenanthroline), TpPyPB (1,3,5-tri(p-pyrid-3-yl-phenyl)benzene) or DPPS (diphenyl bis(4-(pyridin-3-yl)phenyl)silane). The thickness of the hole blocking layer 4 is about ranged between 5 nm and 15 nm, for example, a 10 nm thick BCP layer is used, but the present invention is not limited thereto.

Referring to FIG. 1 again, the negative electrode 5 according to the preferred embodiment of the present invention is formed on the hole blocking layer 4 by means of vapor deposition. The negative electrode 5 can be selected from metals including Al, Ag or Au, or the like. The thickness of the negative electrode 5 is about ranged between 50 nm and 150 nm, for example, a 100 nm thick aluminum metal coating is used, but the present invention is not limited thereto.

In one embodiment of the present invention, the present invention provides a method for manufacturing a hybrid organic solar cell with perovskite structure as absorption material, and the method includes the following steps of:

(S10) providing a semi-finished product which sequentially includes a conductive substrate 1 and a hole transport layer 2 from bottom to top;

(S20) preparing an organic-inorganic hybrid solution with perovskite structure as absorption material represented by the equation (I), and spin-coating the organic-inorganic hybrid solution onto the hole transport layer 2 of the semi-finished product to form a light absorption layer 31;

(S30) forming an electron acceptor layer 32 onto the light absorption layer 31 by vapor deposition, the electron acceptor layer 32 being made of at least one type of fullerene ($C_{60}$) or derivatives thereof, wherein the light absorption layer 31 and the electron acceptor layer 32 are combined to form an active layer 3, and a planar heterojunction (PHJ) is formed between the light absorption layer 31 and the electron acceptor layer 32; and (S40) forming a hole blocking layer 4 and a negative electrode 5 onto the electron acceptor layer 32 in turn, so as to form a solid-state hybrid organic solar cell.

In more detail, the semi-finished product is first performed in step (S10). The semi-finished product sequentially includes the conductive substrate 1 and the hole transport layer 2 from bottom to top, wherein the conductive substrate 1 is first provided, such as a commercially available ITO film substrate which includes a glass or flexible substrate (e.g., PET) and an ITO film. The thickness of the ITO film is about 200 nm. Then, a surface of the ITO film of the conductive substrate 1 can be sequentially washed with cleaning agents, deionized water, acetone and isopropyl alcohol, and then the hole transport layer 2 is formed by a spin coating. The hole transport layer 2 can be selected from PEDOT:PSS, and the hole transport layer 2 can be formed on the transparent conductive film 12 by a spin coating process with a spinning speed of 4000 rpm. Herewith, the thickness of the hole transport layer 2 is about ranged between 25 DM and 40 nm. After completing step (S10) and before executing the following step (S20), Sub-step (S11) can be firstly executed in the present invention, that is, the semi-finished product is pre-heated for 5-10 minutes at 55-65° C. (e.g., 5 minutes at 60° C.).

Then, in step (S20), which can be subdivided into the following sub-steps:

(S21) preparing a methylamine ($CH_3NH_2$) aqueous solution (13.5 ml, 40 wt %) and hydroiodic acid (HI) aqueous solution (15.0 ml, 57 wt %), respectively;

(S22) stirring to mix the methylamine ($CH_3NH_2$) aqueous solution and hydroiodic acid (HI) aqueous solution at 0° C. for 2 hour under a nitrogen atmosphere to form methyl ammonium iodide ($CH_3NH_3I$), removing the solvent (water) by a rotary evaporator, drying methyl ammonium iodide for the formation of methyl ammonium iodide powder, washing the methyl ammonium iodide powder three times by diethyl ether, and then drying at 60° C. for overnight under a vacuum;

(S23) adding the methyl ammonium iodide powder ($CH_3NH_3I$) and lead iodide ($PbI_2$) powder (1:1 molar ratio of $CH_3NH_3I:PbI_2$; i.e., 0.8 g:2.3 g) into a r-butyrolactone organic solvent (15.8 ml) at 60° C. for 12 hour under a nitrogen atmosphere to form the organic-inorganic hybrid solution of perovskite structure as absorption material ($CH_3NH_3PbI_3$) at a concentration of 10.3 wt %; and (S24) then, taking the organic-inorganic hybrid solution, and spin-coating the organic-inorganic hybrid solution onto a pre-heated surface of the hole transport layer 2 of the semi-finished product about 30 seconds by a spinning speed of 6000-8000 rpm (e.g., 6000 rpm) to form the light absorption layer 31. A process for pre-heating a surface of the hole transport layer 2 is to insure the rapid evaporation of an organic solvent within the organic-inorganic hybrid solution, and to inhibit the coarsening of crystals of the light absorption layer 31. Step (S25) can be selectively executed after completing step (S24), that is, the light absorption layer 31 is annealed for 10-20 minutes at 95-105° C. (e.g., 15 minutes at 100° C.). Herewith, the thickness of the light absorption layer 31 is about 20 nm. Furthermore, the r-butyrolactone organic solvent used in above sub-step (S23) can be changed to dimethylformamide (DMF).

In above sub-steps (S21)-(S24), iodine (I) can be changed to bromine (Br), and that becomes the following sub-steps:

(S21) preparing a methylamine ($CH_3NH_2$) aqueous solution and a hydrobromic acid (HBr) aqueous solution, respectively;

(S22) mixing the methylamine aqueous solution and the hydrobromic acid aqueous solution to form methyl ammonium bromide ($CH_3NH_3Br$), and drying methyl ammonium bromide for the formation of methyl ammonium bromide powder;

(S23) adding the methyl ammonium bromide powder and lead bromide ($PbBr_2$) into an organic solvent to form an organic-inorganic hybrid solution with perovskite structure as absorption material ($CH_3NH_3PbBr_3$); and (S24) spin-coating the organic-inorganic hybrid solution onto the hole transport layer 2 of the semi-finished product in turn, so as to form the light absorption layer 31. In another embodiment, $CH_3NH_3PbI_2Cl$ or $CH_3NH_3PbI_2Br$ can be prepared by using different ratios of hydroiodic acid (HI)/hydrochloric acid (HCl)/hydrobromic acid (HBO and lead iodide ($PbI_2$)/lead chloride ($PbCl_2$)/lead bromide ($PbBr_2$).

Subsequently, in step (S30), the electron acceptor layer 32 is thermally deposited on the light absorption layer 31 in a vacuum chamber ($10^{-6}$ torr). The electron acceptor layer 32 is made of at least one type of fullerene or derivatives thereof, such as a $C_{60}$ layer (30 nm), a $PC_{61}BM$ layer (25 nm) or an ICBA layer (30 nm). The light absorption layer 31 and the electron acceptor layer 32 are combined to form the active layer 3, and the planar heterojunction (PHJ) is formed between the light absorption layer 31 and the electron acceptor layer 32. Morphologies of the planar heterojunction (PHJ) will be discussed hereinafter.

In step (S40), also in the vacuum chamber ($10^{-6}$ torr), the hole blocking layer 4 (e.g., a 10 nm thick BCP layer) and the negative electrode 5 (e.g., a 100 am thick aluminum metal coating) are manufactured on the electron acceptor layer 32 by a vapor depositing process. The solid-state hybrid organic solar cell can be manufactured by executing above steps (S10)-(S40) in the present invention.

Referring to Table 1 below, Table 1 discloses comparison of photoelectric performance parameters of different active layers 3 within the hybrid organic solar cell according to various exemplary embodiments of the present invention, wherein groups 1-3 and 4-6 respectively are to use the r-butyrolactone organic solvent and DMF in sub-step (S23) to prepare the organic-inorganic hybrid solution of perovskite structure as absorption material required for the spin coating of the light absorption layer 31; as well as the electron acceptor layer 32 is made of $C_{60}$ in groups 1 and 4, the electron acceptor layer 32 is made of $PC_{61}BM$ in groups 2 and 5, and the electron acceptor layer 32 is made of ICBA in groups 3 and 6. Other layers of each hybrid organic solar cell are the same, the other layers are glass/ITO film/PEDOT:PSS/active layer/BCP/Al, respectively, and measurements of open circuit voltage ($V_{oc}$), short circuit current ($J_{sc}$), fill factor (FF), power conversion efficiency (PCE), series resistance ($R_S$) and parallel resistance ($R_p$) are executed under Sun AM 1.5 simulated sunlight (1×).

TABLE 1

| hybrid organic solar cell | $V_{OC}$ (V) | $J_{SC}$ (mA/cm$^2$) | FF | PCE (%) | $R_S$ (ohm cm$^2$) | $R_P$ (M ohm) |
|---|---|---|---|---|---|---|
| $CH_3NH_3PbI_3$/$C_{60}$ (30 nm) | 0.55 | 5.21 | 0.57 | 1.6 | 4.49 | 2.01 |
| $CH_3NH_3PbI_3$/PCBM (25 nm) | 0.65 | 5.89 | 0.63 | 2.4 | 4.50 | 19.39 |
| $CH_3NH_3PbI_3$/ICBA (30 nm) | 0.75 | 5.44 | 0.51 | 2.1 | 8.31 | 17.21 |
| $CH_3NH_3PbI_3$(DMF)/$C_{60}$ (30 nm) | 0.55 | 9.02 | 0.61 | 3.0 | 1.75 | 0.44 |
| $CH_3NH_3PbI_3$(DMF)/PCBM (25 nm) | 0.60 | 10.32 | 0.63 | 3.9 | 1.82 | 3.93 |
| $CH_3NH_3PbI_3$(DMF)/ICBA (30 nm) | 0.58 | 10.03 | 0.58 | 3.4 | 2.42 | 1.53 |

Figure 2:
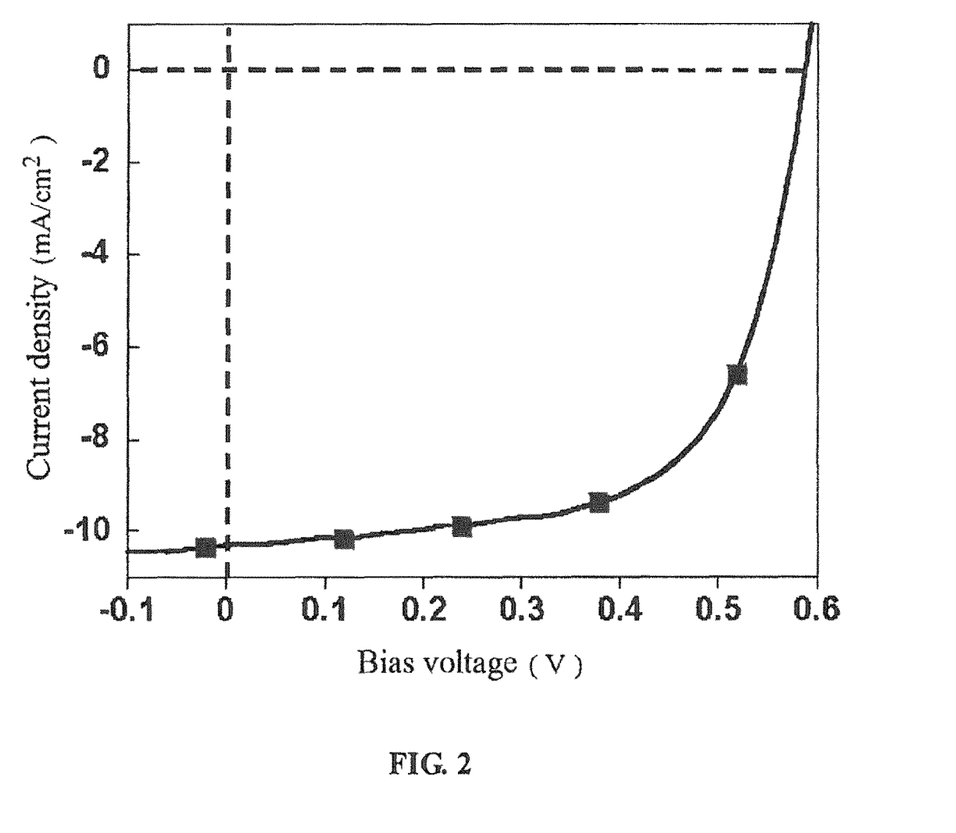
FIG. 2 is a current density-voltage (J-V) of curve the hybrid organic solar cell with perovskite structure as absorption material (wherein an active layer is made of $CH_3NH_3PbI_3$ (DMF)/$PC_{61}BM$) according to the preferred embodiment of the present invention.

It can be inferred that the active layers of groups 1-3 and 4-6 which respectively are to execute the spin coating of the light absorption layer 31 by using r-butyrolactone and DMF are compared. It can be seen from the results given in Table 1 that photoelectric performance characteristics of devices of groups 4-6 have relatively good performance, especially $CH_3NH_3PbI_3$(DMF)/$PC_{61}BM$ of group 5 has preferable values of $V_{oc}$=0.60V, $J_{sc}$=10.32 mA/cm$^2$, FF=0.63 and PCE=3.9%. In other experiments, PCE of group 5 has a maximum of 4.54%. Referring also to FIG. 2, FIG. 2 discloses a current density-voltage (J-V) curve of the hybrid organic solar cell with perovskite structure as absorption material according to the preferred embodiment of the present invention, that is, the active layer is made of $CH_3NH_3PbI_3$(DMF)/$PC_{61}BM$ of group 5 given in above Table 1. The reason of performance difference of the above-mentioned groups is that polarity of DMF is higher than that of r-butyrolactone, the DMF has a more solubility of perovskite structure as absorption material ($CH_3NH_3PbI_3$), and therefore use of DMF is relatively advantageous to form a more tight surface morphology structure by a coating process.

Figure 2A:
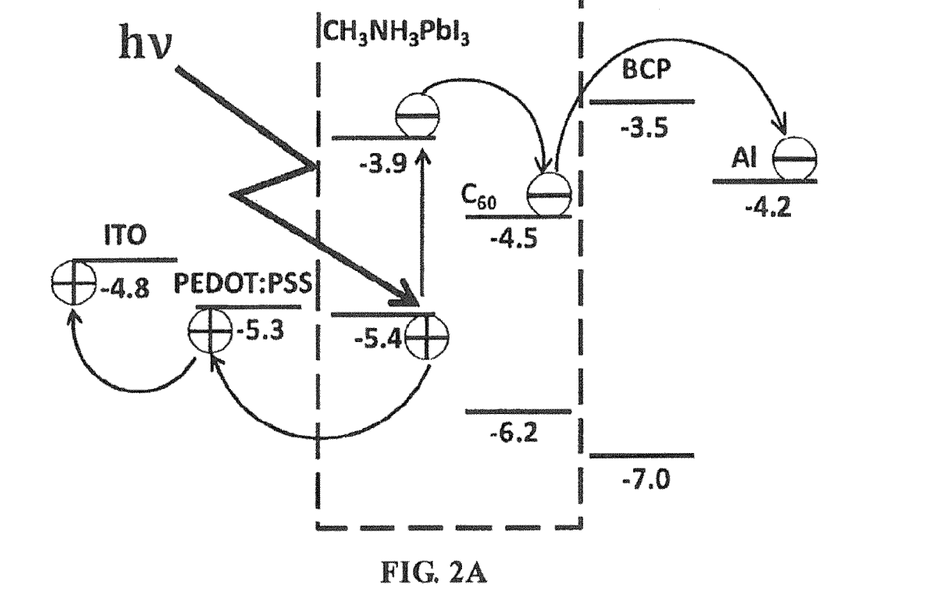
FIGS. 2A and 2B are energy band diagrams of each layer of a device having a light absorption layer of the active layer which is made respectively of $CH_3NH_3PbI_3/C_{60}$ or $CH_3NH_3PbI_3/PC_{61}BM$ according to the preferred embodiment of the present invention.
Figure 2B:
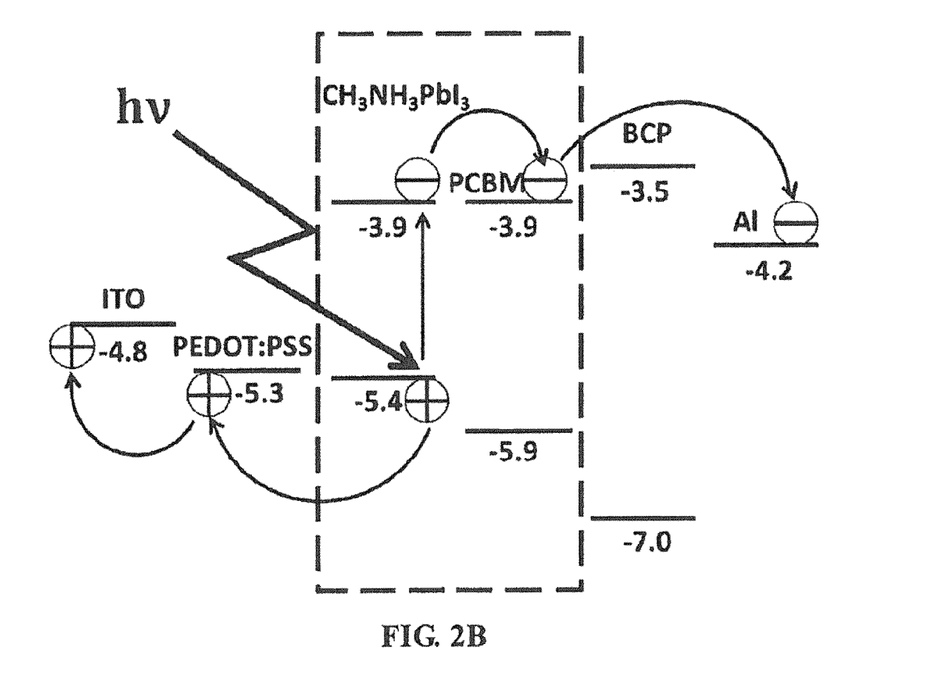

Referring to FIGS. 2A and 2B, FIGS. 2A and 2B disclose energy band diagrams of each layer of a device having a the light absorption layer of the active layer which is made respectively of $CH_3NH_3PbI_3$/$C_{60}$ or $CH_3NH_3PbI_3$/$PC_{61}BM$ according to the present invention, and the device receives sunlight. For the light absorption layer made of $CH_3NH_3PbI_3$/$C_{60}$, a lowest unoccupied molecular orbital (LUMO) and a highest occupied molecular orbital (HOMO) of perovskite structure as absorption material ($CH_3NH_3PbI_3$) are −4.5 eV and −6.2 eV, respectively; for the light absorption layer made of $CH_3NH_3PbI_3$/$PC_{61}BM$, a lowest unoccupied molecular orbital (LUMO) and a highest occupied molecular orbital (HOMO) of perovskite structure as absorption material ($CH_3NH_3PbI_3$) are −3.9 eV and −5.4 eV, respectively, all values above are values of ideal electron acceptor layers, the planar heterojunction (PHJ) can be formed between the electron acceptor layer and the light absorption layer. When the light absorption layer receives sunlight to generate excitons, holes and electrons (the holes corresponding to the electrons) within the excitons will be separated at the heterojunction, and the holes and the electrons are respectively transported in the light absorption layer 31 and the electron acceptor layer 32 to produce a photovoltaic effect.

Figure 3A:
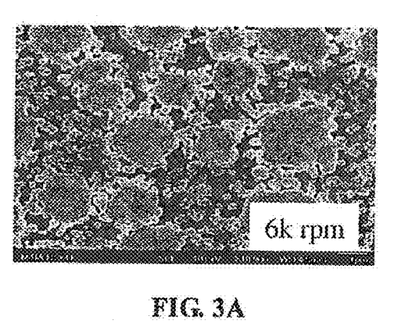
Figure 3B:
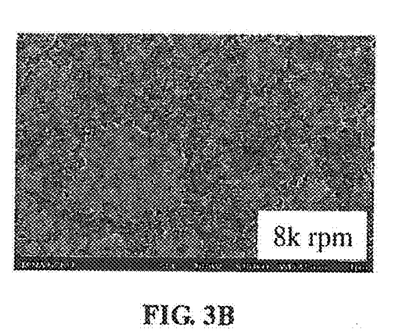

Furthermore, referring to FIGS. 3A and 3B, FIGS. 3A and 3B are scanning electron microscopy (SEM) photographs (both 10000×) of a surface morphology of perovskite structure as absorption material according to the preferred embodiment of the present invention, and the surface morphology of perovskite structure as absorption material is controlled by changing a spinning speed (6000 rpm, 8000 rpm) of a spin coating (both r-butyrolactone) in the spin coating process of step (S20). It can be inferred that the light absorption layer formed by the spin coating has more crystallization area and less vacancy under high rotating speed, thereby is advantageous to obtain a preferred surface morphology.

Figure 3C:
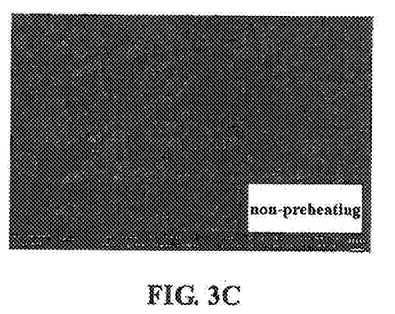
Figure 3D:
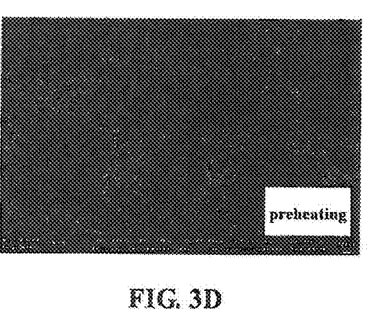

Referring to FIGS. 3C and 3D, FIGS. 3C and 3D are scanning electron microscopy (SEM) photographs (10000× and 5000×, respectively) of a surface morphology of perovskite structure as absorption material according to the preferred embodiment of the present invention, and the surface morphology of perovskite structure as absorption material is controlled by executing without and with a pre-heating process for the surface of the semi-finished product (at room temperature, or 5 minutes at 60° C.) in sub-step (S11). It can be inferred that when there is pre-heated on the surface of the semi-finished product (5 minutes at 60° C.), that is to insure the rapid evaporation of the organic solvent within the organic-inorganic hybrid solution, and to inhibit the coarsening of crystals of the light absorption layer, so that the light absorption layer formed by the spin coating has more crystallization area and less vacancy, thereby is advantageous to obtain the preferred surface morphology. Herewith, sizes of cluster domains of perovskite structure as absorption material observed in FIGS. 3C and 3D are about ranged between 1 μm and 3 μm, and crystal sizes of perovskite structure within the cluster domain are about ranged between 100 nm and 150 nm.

Figure 3E:
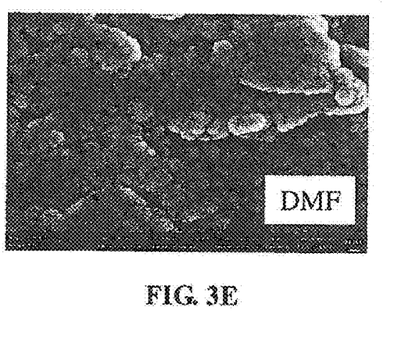
Figure 3F:
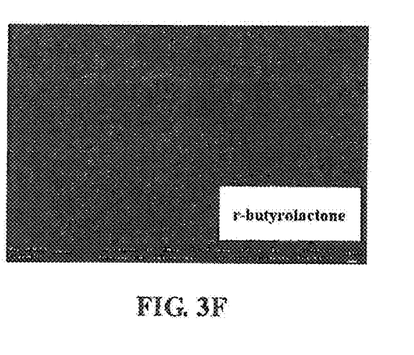

Referring to FIGS. 3E and 3F, FIGS. 3E and 3F are scanning electron microscopy (SEM) photographs (both 10000×) of a surface morphology of perovskite structure as absorption material according to the preferred embodiment of the present invention, and the surface morphology of perovskite structure as absorption material is controlled by using different organic solvents for the spin coating (r-butyrolactone and DMF) in the spin coating process of step (S20). It can be inferred that since a polarity of DMF is higher than that of r-butyrolactone, the DMF has a more solubility of perovskite structure as absorption material ($CH_3NH_3PbI_3$), and therefore use of DMF is relatively advantageous to form the more tight surface morphology structure by the coating process.

Figure 4A:
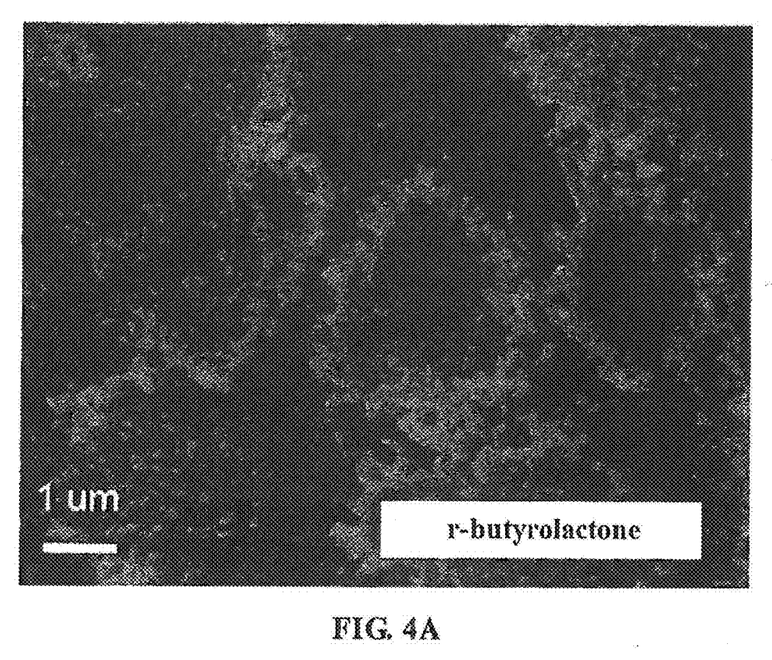
FIGS. 4A and 4B are the atomic force microscopy (AFM) photographs of a surface morphology of perovskite structure as absorption material according to the preferred embodiment of the present invention, the surface morphology of perovskite structure as absorption material is controlled by the use of different organic solvents for the spin coating (r-butyrolactone/6000 rpm; DMF/8000 rpm).
Figure 4B:
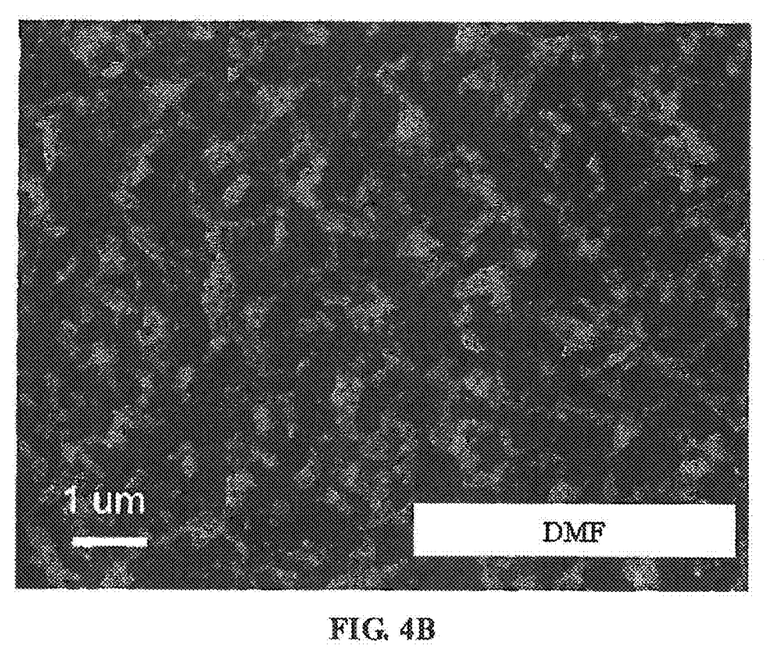

Referring to FIGS. 4A and 4B, atomic force microscopy (AFM) photographs of a surface morphology of perovskite structure as absorption material according to the preferred embodiment of the present invention are illustrated, wherein the surface morphology of perovskite structure as absorption material is controlled by the use of different organic solvents for the spin coating (r-butyrolactone/6000 rpm; DMF/8000 rpm). The results observed in FIGS. 4A and 4B are identical to the results observed in FIGS. 3E and 3F, that is, use of DMF is relatively advantageous to form a more tight surface morphology structure by a coating process.

As above-mentioned, a traditional P3HT absorption material is an organic polymer, so that the traditional P3HT absorption material has drawbacks of complex structure and fabricating process with relatively high cost. In comparison, the light absorption layer of the present invention in FIG. 1 is made of an organic-inorganic hybrid compound having simple structure and fabricating process with relatively low cost, that is, a traditional organic polymer absorption material having complex structure and fabricating process with relatively high cost (e.g., P3HT) are replaced by perovskite structure as absorption material of $C_nH_{2n+1}NH_3XY_3$, while fullerene ($C_{60}$) or derivatives thereof is used as the electron acceptor layer. The planar heterojunction (PHJ) is formed between the light absorption layer and the electron acceptor layer, thereby that is benefic to form the solid-state hybrid organic solar cell (flexible), as well as provide a simple manufacturing method and reduce mass production costs. Furthermore, according to product requirements, the purposes of an improvement and a control of a photoelectrical property of the hybrid organic solar cell can be achieved by using fullerene ($C_{60}$) or derivatives thereof having different lowest unoccupied molecular orbitals (LUMO) as an electron acceptor layer, controlling a surface morphology of perovskite structure as absorption material by means of casting the solution at various spinning speed and changing the solvent of the solution, or using a conductive substrate having different transparent conductive films in the present invention, so that the power conversion efficiency (PCE) of the hybrid organic solar cell reaches above 3%.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A hybrid organic solar cell with perovskite structure as absorption material, comprising: a conductive substrate, a hole transport layer, an active layer, a hole blocking layer and a negative electrode in turn, wherein the active layer comprises:
   a light absorption layer made of perovskite structure as absorption material represented by the following equation (I):

$$C_nH_{2n+1}NH_3XY_3 \qquad (I),$$

wherein n represents an integer of 1 to 9; X represents lead (Pb), tin (Sn) or germanium (Ge); and Y represents at least one of iodine (I), bromine (Br) and chlorine (Cl); and
   an electron acceptor layer made of at least one type of fullerene ($C_{60}$) or derivatives thereof;
   wherein the light absorption layer of the active layer is in contacted with the hole transport layer, the electron acceptor layer is in contacted with the hole blocking layer, and a planar heterojunction (PHJ) is formed between the light absorption layer and the electron acceptor layer.

2. The hybrid organic solar cell of claim 1, wherein the perovskite structure as absorption material is $C_nH_{2n+1}NH_3X(I_mBr_{3-m})$ or $C_nH_{2n+1}NH_3X(I_mCl_{3-m})$, wherein m represents an integer of 1 to 2.

3. The hybrid organic solar cell of claim 1, wherein the perovskite structure as absorption material is $CH_3NH_3PbI_3$, $CH_3NH_3PbBr_3$, $CH_3NH_3PbI_2Cl$ or $CH_3NH_3PbI_2Br$.

4. The hybrid organic solar cell of claim 1, wherein the thickness of the light absorption layer is ranged between 20 nm and 40 nm.

5. The hybrid organic solar cell of claim 1, wherein the derivatives of the fullerene are selected from $PC_{61}BM$, $PC_{71}BM$, $C_{70}$ or ICBA.

6. The hybrid organic solar cell of claim 1, wherein the thickness of the electron acceptor layer is ranged between 20 nm and 40 nm.

7. The hybrid organic solar cell of claim 1, wherein the conductive substrate is selected from indium tin oxide (ITO) film substrate, aluminum zinc oxide (AZO) film substrate or indium zinc oxide (IZO) film substrate; and the conductive substrate has a flexible substrate or a rigid substrate.

8. The hybrid organic solar cell of claim 7, wherein the flexible substrate is selected from polyethylene terephthalate (PET), polyethersulfone (PES), polyethylene naphthalate (PEN) or polycarbonate (PC).

9. The hybrid organic solar cell of claim 1, wherein the hole transport layer is selected from PEDOT:PSS, TFB or PTPD; the hole blocking layer is selected from BCP, Bphen, TpPyPB or DPPS; and the negative electrode is selected from aluminum (Al), silver (Ag) or gold (Au).

10. A method for manufacturing a hybrid organic solar cell with perovskite structure as absorption material, the method comprising steps of:
    providing a semi-finished product, the semi-finished product sequentially comprising a conductive substrate and a hole transport layer from bottom to top;
    preparing an organic-inorganic hybrid solution with perovskite structure as absorption material, and spin-coating the organic-inorganic hybrid solution onto the hole transport layer of the semi-finished product to form a light absorption layer, wherein the perovskite structure as absorption material is shown as the following equation (I):

$$C_nH_{2n+1}NH_3XY_3 \qquad (I),$$

wherein n represents an integer of 1 to 9; X represents lead (Pb), tin (Sn) or germanium (Ge); and Y represents at least one of iodine (I), bromine (Br) and chlorine (Cl);
    forming an electron acceptor layer onto the light absorption layer by vapor deposition, the electron acceptor layer being made of at least one type of fullerene ($C_{60}$) or derivatives thereof, wherein the light absorption layer and the electron acceptor layer are combined to form an active layer, and a planar heterojunction (PHJ) is formed between the light absorption layer and the electron acceptor layer; and
    forming a hole blocking layer and a negative electrode onto the electron acceptor layer in turn, so as to form a solid-state hybrid organic solar cell.

11. The method of claim 10, wherein before the light absorption layer is formed by the spin coating, further comprising a step of:
    pre-heating the semi-finished product for 5-10 minutes at 55-65° C.

12. The method of claim 10, wherein the step of the formation for the light absorption layer using the spin coating comprises steps of:
    preparing a methylamine ($CH_3NH_2$) aqueous solution and a hydroiodic acid (HI) aqueous solution, respectively;
    mixing the methylamine aqueous solution and the hydroiodic acid aqueous solution to form methyl ammonium iodide ($CH_3NH_3I$), and drying methyl ammonium iodide for the formation of methyl ammonium iodide powder;
    adding the methyl ammonium iodide powder and lead iodide ($PbI_2$) into an organic solvent to form an organic-inorganic hybrid solution with perovskite structure as absorption material ($CH_3NH_3PbI_3$); and
    spin-coating the organic-inorganic hybrid solution onto the hole transport layer of the semi-finished product to form the light absorption layer.

13. The method of claim 12, wherein the organic solvent is dimethylformamide (DMF) or r-butyrolactone.

14. The method of claim 12, wherein the organic-inorganic hybrid solution is spin-coated at 6000-8000 rpm.

15. The method of claim 10, wherein the step of the formation for the light absorption layer using the spin coating comprises steps of:
    preparing a methylamine ($CH_3NH_2$) aqueous solution and a hydrobromic acid (HBr) aqueous solution, respectively;

mixing the methylamine aqueous solution and the hydrobromic acid aqueous solution to form methyl ammonium bromide ($CH_3NH_3Br$), and drying methyl ammonium bromide for the formation of methyl ammonium bromide powder;

adding the methyl ammonium bromide powder and lead bromide ($PbBr_2$) into an organic solvent to form an organic-inorganic hybrid solution with perovskite structure as absorption material ($CH_3NH_3PbBr_3$); and spin-coating the organic-inorganic hybrid solution onto the hole transport layer of the semi-finished product to form the light absorption layer.

16. The method of claim 15, wherein the organic solvent is dimethylformamide (DMF) or r-butyrolactone.

17. The method of claim 15, wherein the organic-inorganic hybrid solution is spin-coated at 6000-8000 rpm.

18. The method of claim 10, wherein after the light absorption layer is formed by the spin coating, further comprising a step of:

annealing the light absorption layer for 10-20 minutes at 95-105° C.

* * * * *